US012811333B2

(12) United States Patent
Hirakimoto et al.

(10) Patent No.: US 12,811,333 B2
(45) Date of Patent: Nov. 24, 2026

(54) BOARD CONNECTOR AND ELECTRICAL DEVICE

(71) Applicant: SUMITOMO WIRING SYSTEMS, LTD., Mie (JP)

(72) Inventors: Takuma Hirakimoto, Mie (JP); Naoya Akimoto, Mie (JP); Keiichi Yoshida, Mie (JP); Naoki Watanabe, Mie (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 336 days.

(21) Appl. No.: 18/596,128

(22) Filed: Mar. 5, 2024

(65) Prior Publication Data

US 2024/0313462 A1 Sep. 19, 2024

(30) Foreign Application Priority Data

Mar. 15, 2023 (JP) ................................ 2023-040607

(51) Int. Cl.
*H01R 13/502* (2006.01)
*H01R 12/58* (2011.01)
*H05K 5/00* (2006.01)

(52) U.S. Cl.
CPC ........... *H01R 13/502* (2013.01); *H01R 12/58* (2013.01); *H05K 5/0069* (2013.01)

(58) Field of Classification Search
CPC ..... H01R 13/502; H01R 12/58; H05K 5/0069
USPC ........................................................ 439/76.1
See application file for complete search history.

(56) References Cited

U.S. PATENT DOCUMENTS

| | | | | |
|---|---|---|---|---|
| 4,822,303 A * | 4/1989 | Nakamura | H01R 13/658 | 439/554 |
| 5,344,327 A * | 9/1994 | Brunker | H01R 13/658 | 439/9 |
| 5,511,984 A * | 4/1996 | Olson | H01R 12/82 | 439/937 |
| 5,980,325 A * | 11/1999 | Horchler | H01R 43/20 | 439/701 |
| 6,007,381 A * | 12/1999 | Ando | H01R 12/7064 | 439/607.42 |
| 6,811,449 B2 * | 11/2004 | Yamashita | H01R 13/41 | 439/733.1 |

(Continued)

FOREIGN PATENT DOCUMENTS

JP 2021-005445 A 1/2021

*Primary Examiner* — Tulsidas C Patel
*Assistant Examiner* — Thomas K Quigley
(74) *Attorney, Agent, or Firm* — Venjuris, P.C.

(57) ABSTRACT

A board connector is to be mounted on a board, and provided with a plurality of terminals, a housing for holding outer connecting portions of the plurality of respective terminals with coupling portions and board-side connecting portions of the plurality of respective terminals caused to extend outside, and an auxiliary member supported by the housing on a side where the coupling portions and the board-side connecting portions extend. At least one of the plurality of terminals is a power terminal. The auxiliary member includes an alignment plate having a plurality of through holes, through which the board-side connecting portions of the plurality of terminals are respectively passed. The alignment plate includes protrusions, and located between the plurality of through holes, for increasing creepage distances between the board-side connecting portions respectively passed through the plurality of through holes.

8 Claims, 9 Drawing Sheets

(56) References Cited

U.S. PATENT DOCUMENTS

| | | | | |
|---|---|---|---|---|
| 7,033,229 | B2 * | 4/2006 | Tsuchiya | H01R 12/724 439/733.1 |
| 9,281,160 | B2 * | 3/2016 | Sato | H01J 27/024 |
| 9,997,867 | B2 * | 6/2018 | Moriyasu | H01R 24/20 |
| 10,205,263 | B2 * | 2/2019 | Hashimoto | H01R 13/405 |
| 11,043,771 | B2 * | 6/2021 | Shinoda | H01R 12/55 |
| 11,056,817 | B2 * | 7/2021 | Liang | H01R 13/4361 |
| 11,637,394 | B2 * | 4/2023 | Zhang | H01R 12/707 439/629 |
| 11,837,808 | B2 * | 12/2023 | Maesoba | H01R 13/424 |
| 2002/0052135 | A1 * | 5/2002 | Noguchi | H01R 13/641 439/352 |
| 2004/0009685 | A1 * | 1/2004 | Yamashita | H01R 13/41 439/79 |
| 2004/0266269 | A1 * | 12/2004 | Miyazaki | H01R 13/512 439/660 |
| 2010/0203765 | A1 * | 8/2010 | Goossens | H01R 13/6461 439/626 |
| 2010/0273362 | A1 * | 10/2010 | Matsuoka | H01R 9/18 439/737 |
| 2018/0123305 | A1 * | 5/2018 | Misu | H01R 43/24 |
| 2019/0190197 | A1 * | 6/2019 | Ohsako | H01R 13/436 |
| 2020/0185843 | A1 * | 6/2020 | Miyamura | H01R 13/41 |
| 2021/0376516 | A1 * | 12/2021 | Zhang | H01R 12/724 |
| 2022/0102885 | A1 * | 3/2022 | Maesoba | H01R 24/50 |
| 2024/0266766 | A1 * | 8/2024 | Liao | H01R 12/7082 |
| 2024/0313462 | A1 * | 9/2024 | Hirakimoto | H01R 12/724 |
| 2024/0380143 | A1 * | 11/2024 | Hara | H01R 12/62 |

* cited by examiner

BOARD CONNECTOR AND ELECTRICAL DEVICE

CROSS-REFERENCE TO RELATED APPLICATIONS

This application is based on and claims priority from Japanese Patent Application No. 2023-040607, filed on Mar. 15, 2023, with the Japan Patent Office, the disclosure of which is incorporated herein in its entirety by reference.

TECHNICAL FIELD

The present disclosure relates to a board connector and an electrical device.

BACKGROUND

Japanese Patent Laid-open Publication No. 2021-005445 discloses a board connector provided with a housing, a terminal fitting held through the housing and including a board connecting portion to be disposed outside the housing and passed through a through hole of a circuit board, and an alignment plate for positioning the board connecting portion passed therethrough toward the circuit board.

SUMMARY

Terminal fittings may be used as electrically conductive paths for power. In such a case, it is desired to further improve insulation property between the terminal fittings.

Accordingly, the present disclosure aims to more improve insulation property between terminals.

The present disclosure is directed to aboard connector to be mounted on aboard, the board connector being provided with a plurality of terminals each including an outer connecting portion, a board-side connecting portion and a coupling portion located between the outer connecting portion and the board-side connecting portion, a housing for holding the outer connecting portions of the plurality of respective terminals with the coupling portions and the board-side connecting portions of the plurality of respective terminals caused to extend outside, and an auxiliary member supported by the housing on a side where the coupling portions and the board-side connecting portions extend, at least one of the plurality of terminals being a power terminal, the auxiliary member including an alignment plate having a plurality of through holes, the board-side connecting portions of the plurality of terminals being respectively passed through the through holes, and the alignment plate including protrusions located between the plurality of through holes for increasing creepage distances between the board-side connecting portions respectively passed through the plurality of through holes.

The present disclosure is also directed to an electrical device with the above board connector, an enclosure including an opening, and the board accommodated in the enclosure, the board connector being fixed to the enclosure while being passed through the opening, and the board-side connecting portions extending from the housing being fixed to the board in the enclosure.

According to the present disclosure, insulation property between terminals can be more improved.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
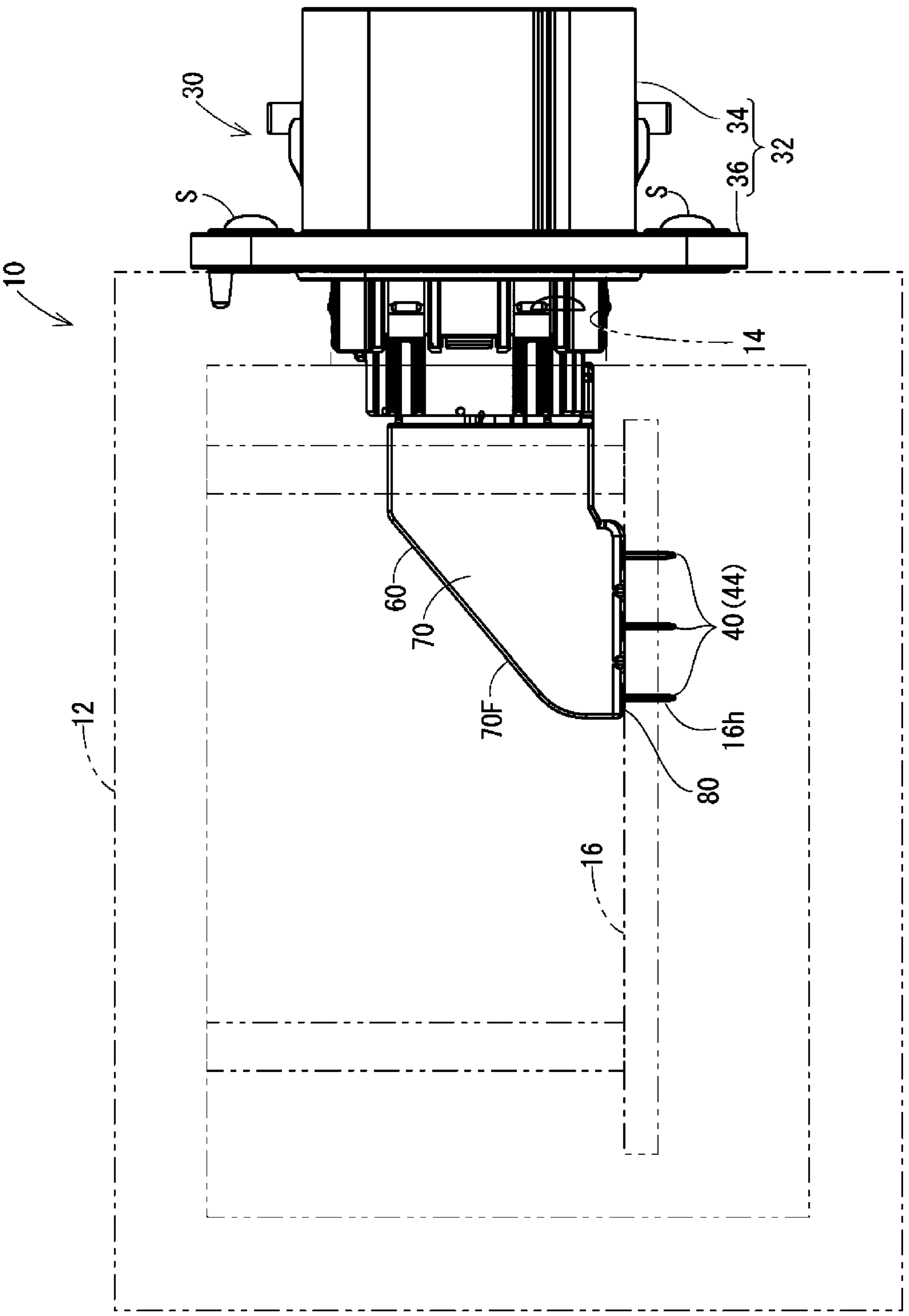
FIG. 1 is a schematic diagram showing an electrical device according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

DESCRIPTION of Embodiments of Present Disclosure

First, embodiments of the present disclosure are listed and described.

The board connector of the present disclosure is as follows.

(1) The board connector is to be mounted on a board, and provided with a plurality of terminals each including an outer connecting portion, a board-side connecting portion and a coupling portion located between the outer connecting portion and the board-side connecting portion, a housing for holding the outer connecting portions of the plurality of respective terminals with the coupling portions and the board-side connecting portions of the plurality of respective terminals caused to extend outside, and an auxiliary member supported by the housing on a side where the coupling portions and the board-side connecting portions extend, at least one of the plurality of terminals being a power terminal, the auxiliary member including an alignment plate having a plurality of through holes, the board-side connecting portions of the plurality of terminals being respectively passed through the through holes, and the alignment plate including protrusions located between the plurality of through holes for increasing creepage distances between the board-side connecting portions respectively passed through the plurality of through holes.

According to this board connector, the creepage distances between the board-side connecting portions respectively passed through the plurality of through holes are increased. In this way, insulation property between the terminals is more improved.

(2) In the board connector of (1), the protrusions may include opening peripheral edge protrusions formed along edges of the through holes.

In this case, the creepage distances can be increased by the opening peripheral edge protrusions.

(3) In the board connector of (2), the opening peripheral edge protrusion may have a guiding surface for guiding the board-side connecting portion into the through hole.

The board-side connecting portion is easily inserted into the through hole by this guiding surface.

(4) In the board connector of any one of (1) to (3), the protrusions may include an intermediate protrusion separated from the plurality of through holes and located between the plurality of through holes.

The creepage distances can be increased by this intermediate protrusion.

(5) In the board connector of any one of (1) to (4), the protrusions may be formed on both surfaces of the alignment plate.

In this way, the creepage distances can be increased on the both surfaces of the alignment plate.

(6) In the board connector of any one of (1) to (5), the board-side connecting portions of the plurality of respective terminals may extend in a direction intersecting the outer connecting portions.

If the board-side connecting portions extend in the direction intersecting the outer connecting portions in this way, the positions of the board-side connecting portions are easily disordered. In such a case, the plurality of board-side connecting portions are easily held at fixed positions by the alignment plate.

(7) In the board connector of any one of (1) to (6), the auxiliary member may include a pair of protection plates for collectively covering the coupling portions of the plurality of terminals from both sides.

In this way, the terminals can be protected by the pair of protection plates.

Further, the electrical device of the present disclosure is as follows.

(8) The electrical device is provided with the board connector of any one of (1) to (7), an enclosure including an opening, and the board accommodated in the enclosure, the board connector being fixed to the enclosure while being passed through the opening, and the board-side connecting portions extending from the housing being fixed to the board in the enclosure.

In this way, the electrical device having improved insulation property between the terminals is provided.

Details of Embodiment of Present Disclosure

Specific examples of a board connector and an electrical device of the present disclosure are described below with reference to the drawings. Note that the present disclosure is not limited to these illustrations, but is represented by claims and intended to include all changes in the scope of claims and in the meaning and scope of equivalents.

Embodiment

Hereinafter, a board connector and an electrical device according to an embodiment are described.

FIG. 1 is a schematic diagram showing an electrical device 10. The electrical device 10 is provided with a board connector 30, an enclosure 12 and a board 16.

The board 16 is formed with a circuit by a copper foil. Mounting components such as a semiconductor chip and a resistor may be mounted on the board 16. The board 16 is formed with through holes 16*h*.

The enclosure 12 is formed into a box shape to accommodate the board 16. The enclosure 12 is, for example, formed of metal. The enclosure 12 may be formed of resin.

The enclosure 12 is formed with an opening 14. The opening 14 is for arranging the board connector 30 passed therethrough. The board 16 may be fixed in the enclosure 12 by screwing or the like.

The board connector 30 is a connector for relaying the circuit of the board 16 and a circuit connected to an external connector in a state mounted on the board 16. The board connector 30 includes terminals 40, 50, and one end parts of the terminals 40, 50 are held in the board connector 30 and facing the outside of the enclosure 12. By connecting the external connector to the board connector 30, terminals of the external connector are electrically connected to the one end parts of the terminals 40, 50.

The board connector 30 is arranged to pass through the opening 14, whereby the terminals 40, 50 pass between the inside and outside of the enclosure 12. The other ends of the terminals 40, 50 extend toward the inside of the enclosure 12 from the board connector 30. A part of the board 16 is arranged in the opening 14. By connecting the other end parts of the terminals 40, 50 to the through holes 16*h* formed in the board 16, the other end parts of the terminals 40, 50 are electrically connected to the circuit of the board 16.

The other end parts of the terminals 40, 50 may be soldered in a state connected to the through holes 16*h*. By press-fitting the other end parts of the terminals 40, 50 into the through holes 16*h*, the other end parts of the terminals 40, 50 may be pressed against conductors formed on the inner peripheral surfaces of the through holes 16*h*.

It is not essential that the board connector 30 is passed through and arranged in the opening 14 of the enclosure 14. An assembly obtained by mounting and fixing the board connector 30 on the board 16 may be called a board with a connector.

Figure 2:
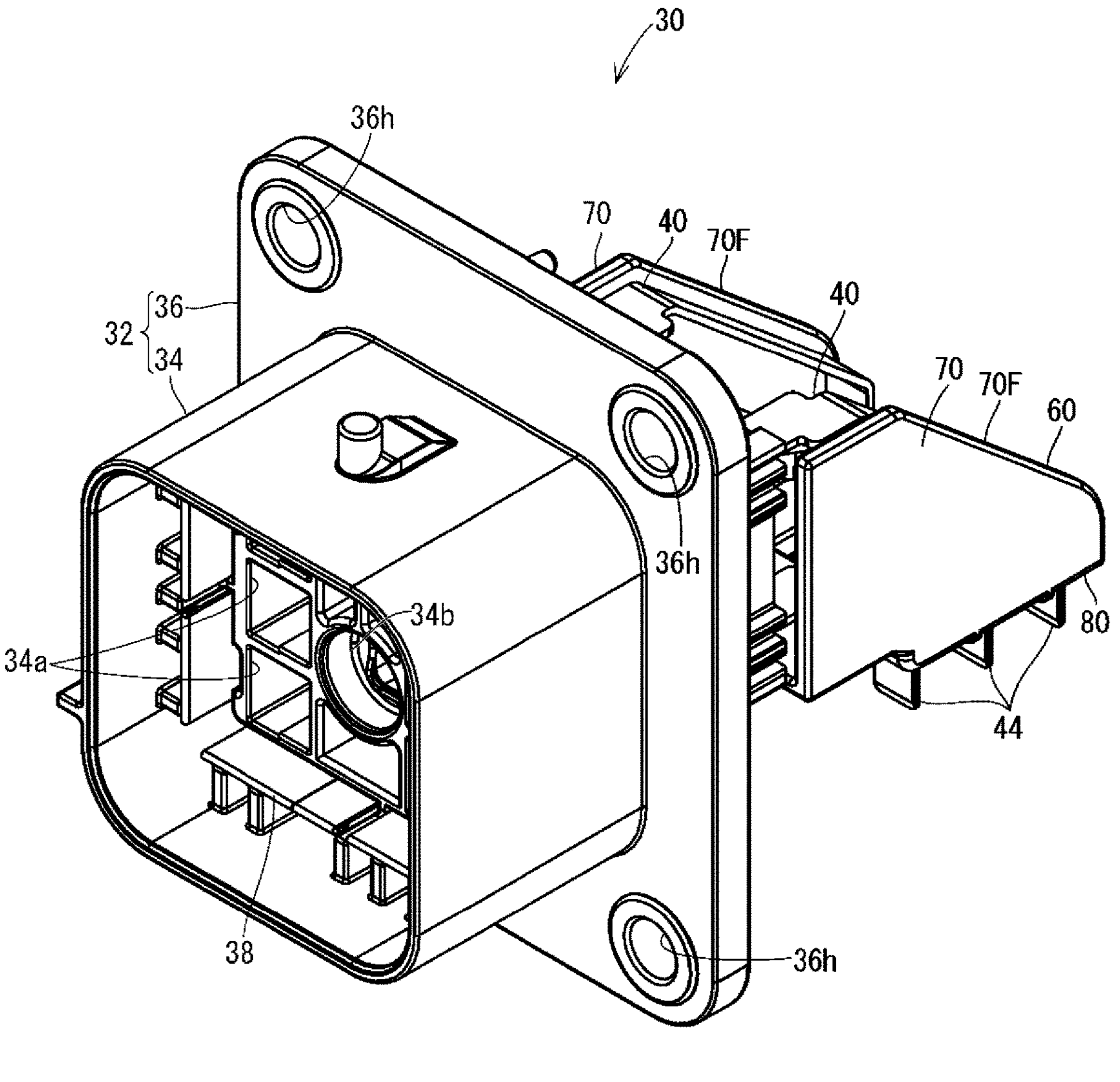
FIG. 2 is a perspective view showing a board connector.
Figure 3:
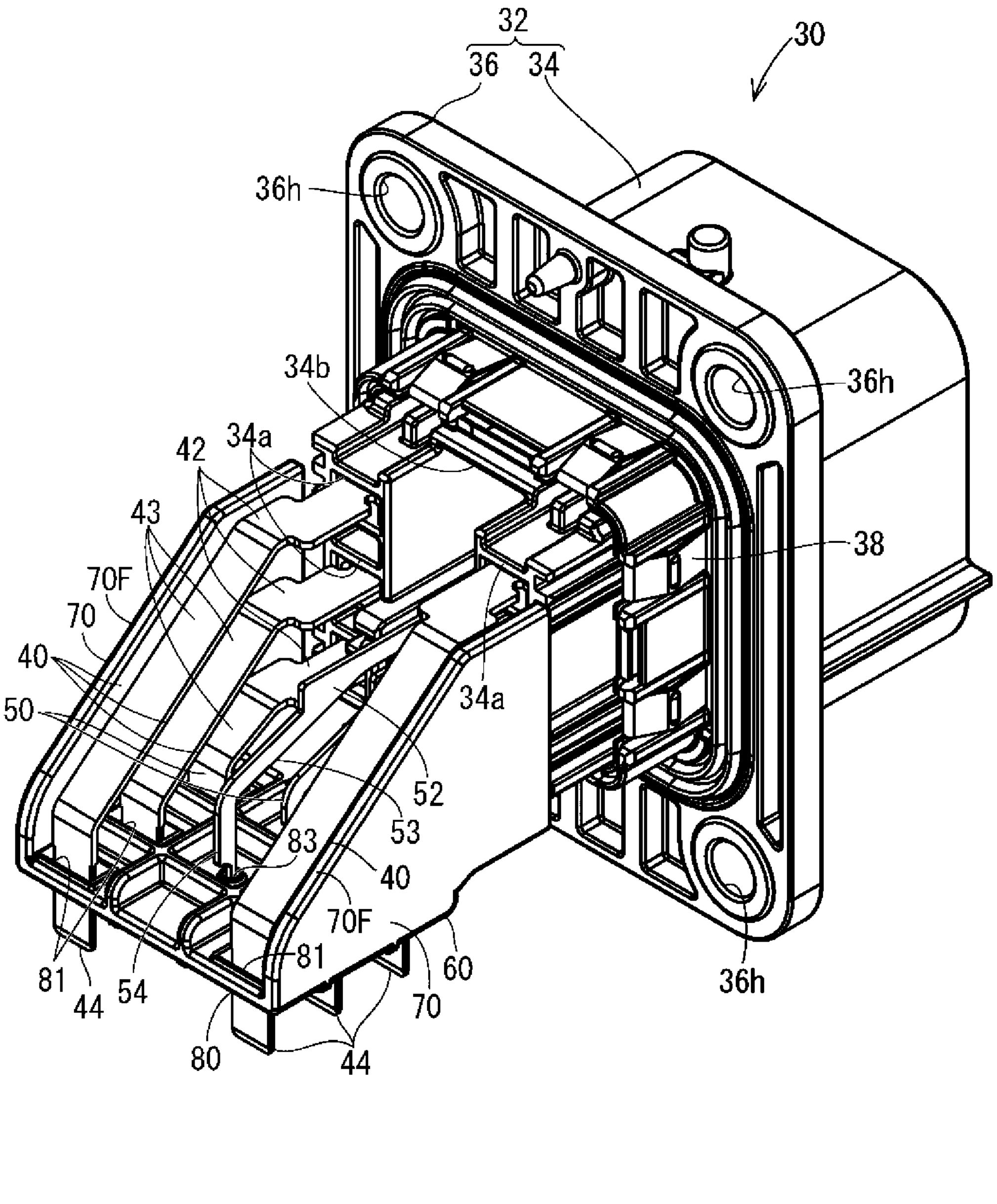
FIG. 3 is a perspective view showing the board connector.
Figure 4:
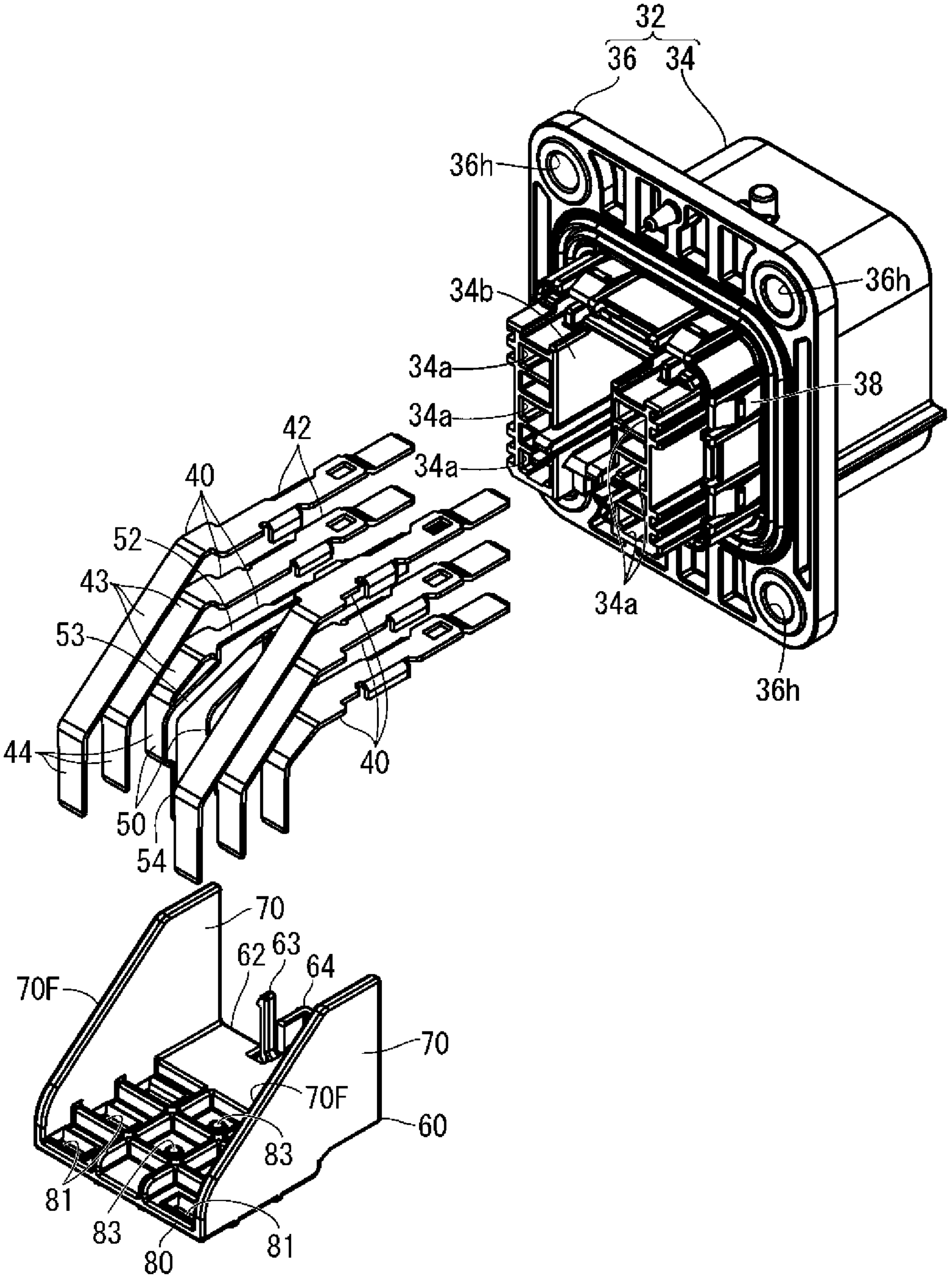
FIG. 4 is an exploded perspective view of the board connector.
Figure 5:
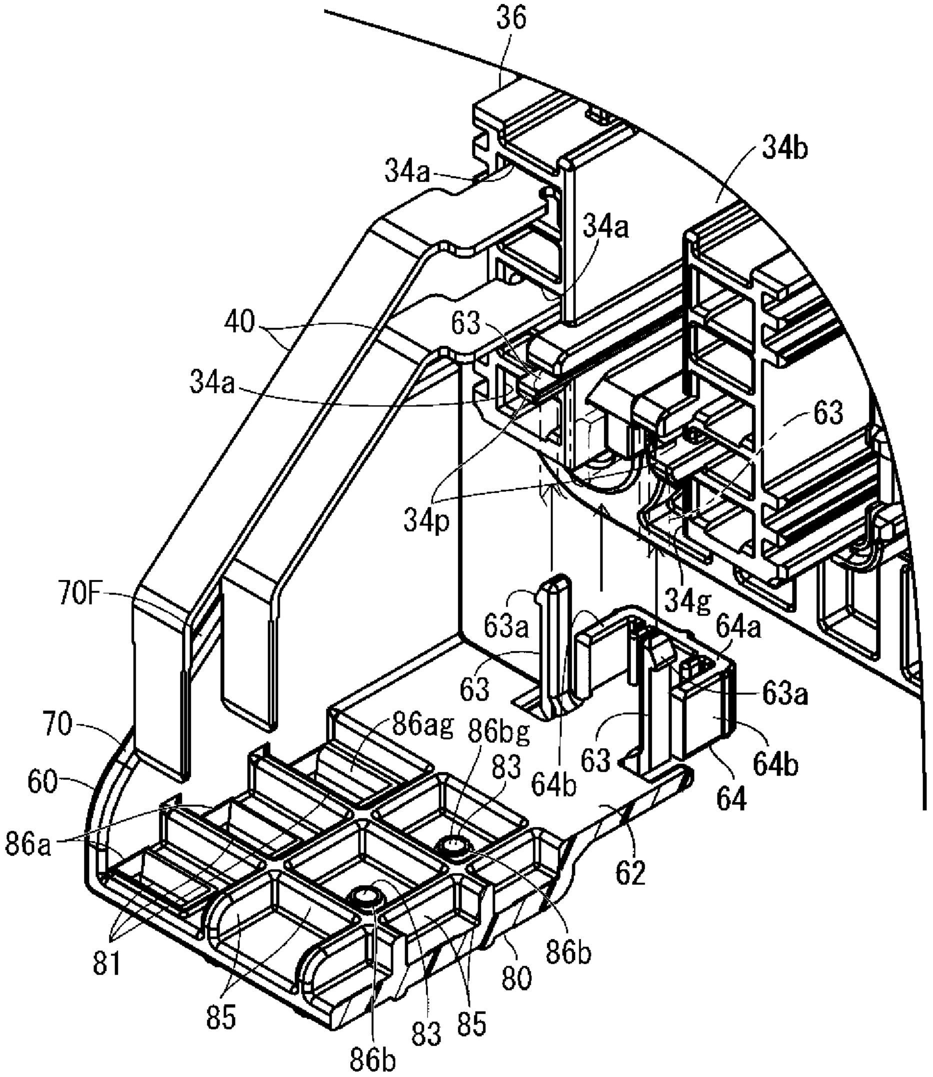
FIG. 5 is an exploded perspective view partially cut away of the board connector.
Figure 6:
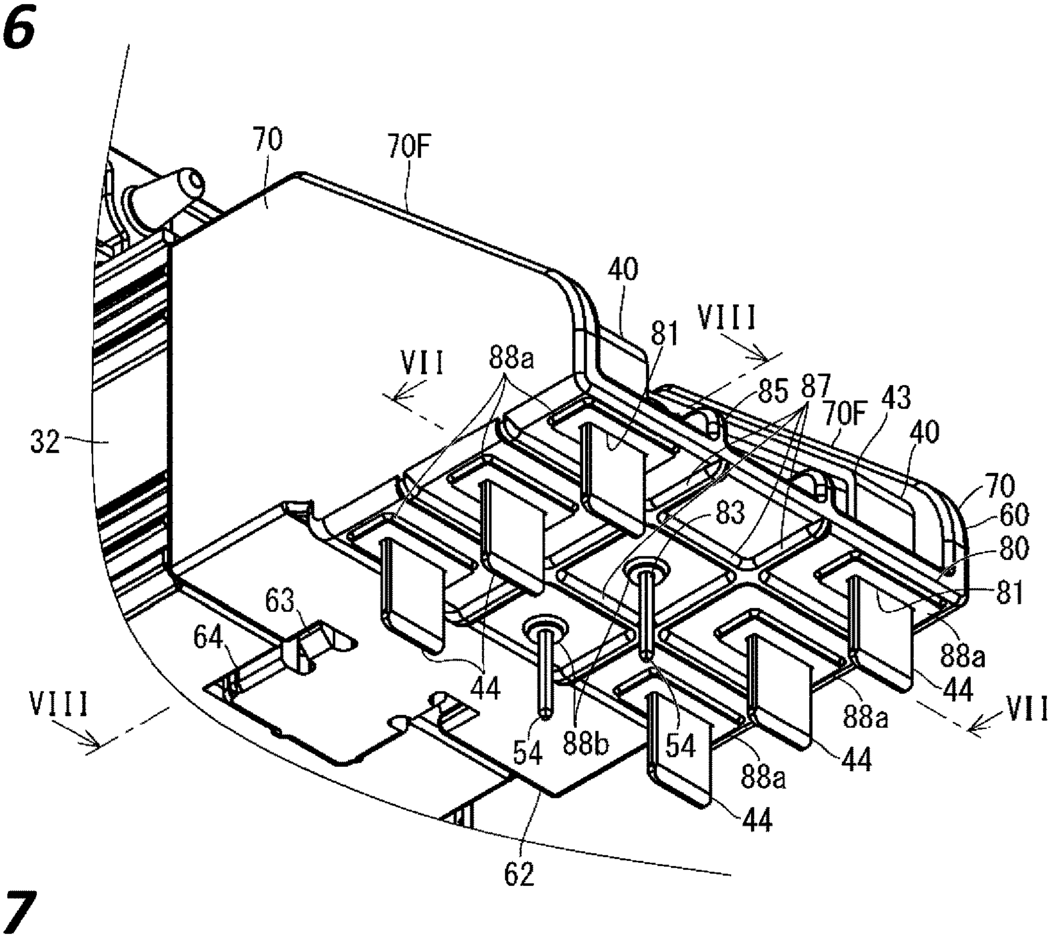
FIG. 6 is a partial perspective view of the board connector when viewed from a back surface side.

The board connector 30 is more specifically described. FIGS. 2 and 3 are perspective views showing the board connector 30. FIG. 4 is an exploded perspective view of the board connector 30. FIG. 5 is an exploded perspective view partially cut away of the board connector 30. In FIG. 5, the terminals 40, 50 are partially not shown. FIG. 6 is a partial perspective view of the board connector 30 when viewed from a back surface side.

The board connector 30 is a connector to be mounted on the board 16 in the enclosure 12 while being passed through the opening 14 of the enclosure 12. The board connector 30 is provided with a plurality of the terminals 40, 50, a housing 32 and an auxiliary member 60.

The terminal 40 is formed of a conductor such as metal. The terminal 40 is, for example, formed by press-working a metal plate of copper or the like. The terminal 40 is an example of a power terminal for supplying power. For example, a voltage of 10 V or more, a voltage of 20V or more or a voltage of 30 V or more may be applied to the terminal 40.

The terminal 40 includes an outer connecting portion 42, a board-side connecting portion 44 and a coupling portion 43 located between the outer connecting portion 42 and the board-side connecting portion 44.

The outer connecting portion 42 is shaped to extend straight, here in the form of an elongated plate. The outer connecting portion 42 is a part to be accommodated into the housing 32 and connected to the terminal of the mating external connector.

The board-side connecting portion 44 is shaped to extend straight, here in the form of an elongated plate. The board-side connecting portion 44 extends in a direction intersecting the outer connecting portion 42. Here, the board-side connecting portion 44 extends in a direction orthogonal to the outer connecting portion 42. The board-side connecting portion 44 is a part to be fixed to the board 16. Here, the board-side connecting portion 44 is fixed to the board side by being connected to the through hole 16*h*. Since the board-side connecting portion 44 intersects the outer connecting portion 42, the board-side connecting portion 44 can be inserted into the through hole 16*h* formed in the board 16 even if the board 16 intersects a part of the enclosure 12 where the opening 14 is formed.

The coupling portion 43 is a part coupling the outer connecting portion 42 and the board-side connecting portion 44 and changing an angle of the board-side connecting portion 44 with respect to the outer connecting portion 42. In this embodiment, the coupling portion 43 is inclined at an obtuse angle to both the outer connecting portion 42 and the board-side connecting portion 44. That is, in an assumed shape in which an outer connecting portion and a board-side connecting portion intersect at a right angle, the coupling portion 43 connects the outer connecting portion and the board-side connecting portion in a short-cut manner before that angle. Thus, an outward projection amount is smaller as compared to the assumed shape in which the outer connecting portion and the board-side connecting portion intersect at a right angle.

In this embodiment, the board connector 30 is provided with a plurality of the terminals 40. More specifically, the board connector 30 is provided with six terminals 40. Three terminals 40 are arranged on one side of the board connector 30, and the remaining three terminals are arranged on the other side of the board connector 30. The respective parts of the respective terminals 40 may differ in length. For example, in the arrangement relationship of the three terminals 40, the terminal 40 located more inside may include the coupling portion 43 having a shorter length.

The terminal 50 is formed of a conductor such as metal. The terminal 50 is, for example, formed by press-working a metal plate of copper or the like. The terminal 50 may be a signal terminal or a terminal for supply lower voltage power than the terminal 40.

The terminal 50 includes an outer connecting portion 52, a board-side connecting portion 54 and a coupling portion 53 located between the outer connecting portion 52 and the board-side connecting portion 54.

The outer connecting portion 52 is a part to be accommodated into the housing 32 in parallel to the outer connecting portions 42 and to be connected to the terminal of the mating external connector.

The board-side connecting portion 54 extends in a direction intersecting the outer connecting portion 52. Here, the board-side connecting portion 54 extends in a direction orthogonal to the outer connecting portion 52. The board-side connecting portion 54 is a part to be fixed to the board 16, similarly to the board-side connecting portion 44, in parallel to the board-side connecting portions 44.

The coupling portion 53 is a part coupling the outer connecting portion 52 and the board-side connecting portion 54 and changing an angle of the board-side connecting portion 54 with respect to the outer connecting portion 52. In this embodiment, the coupling portion 53 is inclined at an obtuse angle to both the outer connecting portion 52 and the board-side connecting portion 54. The coupling portion 53 may or may not be parallel to the coupling portions 43.

In this embodiment, the board connector 30 is provided with a plurality of the terminals 50. More specifically, the board connector 30 is provided with two terminals 50. The two terminals 50 are arranged between the terminals 40 in left and right rows. The respective parts of the respective terminals 50 may differ in length. For example, in the arrangement relationship of the two terminals 50, the terminal 50 located more inside may include the outer connecting portion 52 having a longer length.

The housing 32 is formed of an insulating material such as resin and formed into a shape to hold the outer connecting portions 42, 52 with the coupling portions 43, 53 and the board-side connecting portions 44, 54 caused to extend outside.

More specifically, the housing 32 includes a housing body 34 and a mounting piece 36.

The housing body 34 is formed into a shape to hold the outer connecting portions 42, 52. More specifically, the housing body 34 includes cavities 34*a* for separately accommodating the plurality of outer connecting portions 42. A one-side opening of the cavity 34*a* is open to the outside of the enclosure 12, and an other-side opening of the cavity 34*a* is open to the inside of the enclosure 12. A partition may be formed in an intermediate part of the cavity 34*a* in an extension direction, and the board-side connecting portion 44 may be passed through this partition. In this embodiment, three cavities 34*a* are arranged in the vertical direction on each of left and right sides of the housing body 32.

The housing 32 includes a cavity 34*b* for collectively accommodating the plurality of outer connecting portions 52. A one-side opening of the cavity 34*b* is open to the outside of the enclosure 12, and an other-side opening of the cavity 34*b* is open to the inside of the enclosure 12. A partition may be formed in an intermediate part of the cavity 34*b* in an extension direction, and the board-side connecting portions 54 may be passed through this partition. In this embodiment, the cavity 34*b* is formed in a middle of the housing 32. The plurality of terminals 50 may be supported away from each other by being passed through the partition and held.

The housing 32 is formed to have such an outer shape that the housing 32 can be passed through and arranged in the opening 14 of the enclosure 12.

The mounting piece 36 projects on the periphery of the housing body 34. For example, the mounting piece 36 is in the form of a plate projecting in a direction orthogonal to the extension direction of the cavities 34*a*, 34*b* between the both openings of the cavities 34*a*, 34*b* in the housing body 34. The mounting piece 36 may be partially formed around the housing body 34 or may be entirely formed. In this embodiment, the mounting piece 36 is in the form of an annular rectangular plate entirely projecting around the housing body 34. In this way, waterproof performance is easily improved between the housing 32 and the enclosure 12.

The mounting piece 36 is formed with screw insertion holes 36*h*. For example, the screw insertion hole 36*h* is formed in each of four corner parts of the mounting piece 36.

The mounting piece 36 is formed into a shape expanding larger than the opening 14. With the housing body 34 passed through and arranged in the opening 14, the mounting piece 36 can contact the outer surface of the enclosure 12 around the opening 14. Screw holes are formed at positions of the enclosure 12 corresponding to the screw insertion holes 36 in this state. By screwing screws S into the screw holes of the enclosure 12 through the screw insertion holes 36*h*, the mounting piece 36 is fixed to the enclosure 12 and, hence, the board connector 30 is fixed to the enclosure 12. In this state, the board-side connecting portions 44, 54 extending from the housing 32 are fixed to the board 16 in the enclosure 12.

The mounting piece 36 may be omitted.

The housing 32 may include a shield 38 formed of metal or the like. The shield 38 may be, for example, formed to surround the outer connecting portions 42, 52. If the enclosure 12 is formed of metal, the shield 38 may extend at a position capable of contacting the enclosure 12 on the outer periphery of the housing body 34 or inside the mounting piece 36. In this way, the shield 38 can be grounded via the enclosure 12. Noise shielding performance can be obtained by providing the housing 32 with the shield 38.

The coupling portions 43, 53 extend from a back part of the housing body 34 toward the inside of the housing 12 while being inclined with respect to the outer connecting portions 42, 52. The board-side connecting portions 44, 54 extend in the same direction orthogonal to the outer connecting portions 42, 52 from end parts of the coupling portions 43, 53 on the side of the enclosure 12. In the extension direction of the board-side connecting portions 44, 54, the board-side connecting portions 44, 54 are arranged at the same position and collectively connectable to the board 16.

Further, the plurality of board-side connecting portions 44, 54 are arranged at intervals. Here, on each of the left and right sides, three board-side connecting portions 44 are arranged along the extension direction of the outer connecting portions 42. Further, the two board-side connecting portions 54 are arranged along the extension direction of the outer connecting portions 52 between the board-side connecting portions 44 in the left and right rows.

That is, the six board-side connecting portions 44 are located in both outer columns of 3×3 grid points, and the two board-side connecting portions 54 are located at the positions of the grid points except the one on a side distant from the housing body 34 in a center column of the 3×3 grid points.

The auxiliary member 60 includes a pair of protection plates 70. The pair of protection plates 70 collectively cover the coupling portions 43, 53 of the plurality of terminals 40, 50 from both sides. In this embodiment, the pair of protection plates 70 cover the coupling portions 43, 53 from both directions intersecting a virtual plane, along which the outer connecting portions 42, 52, the coupling portions 43, 53 and the board-side connecting portions 44, 54 are passed.

When viewed along the extension direction of the outer connecting portions 42, 52, it can be said that the board-side connecting portions 44, 54 are located between the pair of protection plates 70 and the board-side connecting portions 44, 54 extend along the inner surfaces of the pair of protection plates 70.

The coupling portion 43, 53 are located between the pair of protection plates 70. When viewed along a direction connecting the pair of protection plates 70, the coupling portions 43, 53 are arranged at positions hidden behind the protection plates 70. Parts connected to the coupling portions 43, 53, out of the outer connecting portions 42, 52, are also located between the pair of protection plates 70. Thus, in inserting the board connector 30 into the opening 14, the protection plates 70 contact the inner surface of the opening 14 before the coupling portions 43, 53 and the like contact the inner surface of the opening 14. In this way, the contact of the coupling portions 43, 53 with the inner surface of the opening 14 is suppressed and the coupling portions 43, 53 are protected.

Each of the pair of protection plates 70 has a guide edge 70F for guiding the auxiliary member 60. The guide edges 70F are edges for guiding the auxiliary member 60 by contacting the inner surface of the opening 14 when the board-side connecting portions 44, 54 and the coupling portions 43, 53 are inserted into the opening 14. In this respect, the protection plates function also as guide plates. The guide edges 70F may come into line contact or surface contact with the inner surface of the opening 14. The guide edges 70F are formed at positions for avoiding the contact of the board-side connecting portions 44, 54 and the coupling portions 43, 53 with the inner surface of the opening 14 while being held in contact with the inner surface of the opening 14.

More specifically, the guide edges 70F are formed as inclined edges inclined toward tip sides of the board-side connecting portions 44, 54 along the extension directions of the coupling portions 43, 53 and the board-side connecting portions 44, 54 with respect to the housing body 34. When viewed along the direction connecting the pair of protection plates 70, the guide edges 70E may be parallel to the coupling portions 43. Further, when viewed along the direction connecting the pair of protection plates 70, the guide edges 70F may be located outside the longest coupling portions 43.

If the guide edges 70F are inclined edges, projection lengths of the tips of the board-side connecting portions 44, 54 with respect to the guide edges 70F can be reduced. In this way, it becomes difficult for the board-side connecting portions 44, 54 to contact the inner peripheral surface of the opening 14.

In this embodiment, the protection plate 70 has such a plate shape that a rectangular extending part is connected to one side of a right triangular shape and a rectangular extending part is connected to the other side. The rectangular extending part on the one side extends toward the housing body 34 and covers coupled parts of the outer connecting portions 42, 52 and the coupling portions 43, 53. The rectangular extending part on the other side covers parts connected to the coupling portions 43, 53, out of the board-side connecting portions 44, 54.

The auxiliary member 60 is, for example, held on the housing 32 by the following configuration. That is, a fixing intermediate piece 62 extends between edges on the side of the board-side connecting portions 44, 54, out of the rectangular extending parts on the one sides. A pair of locking pieces 63 and a fixing guide piece 64 are provided to project inward from the fixing intermediate piece 62 (see FIG. 5). The pair of locking pieces 63 are formed to have a long shape and locking protrusions 63*a* are formed on tip parts thereof. The fixing guide piece 64 is formed into such a shape that a pair of side walls 64*b* extend in a direction orthogonal to an intermediate plate 64*a* from both side edges of the intermediate plate 64*a*.

A guide receiving recess 34*g*, into which the fixing guide piece 64 is fit, is formed in a part projecting toward the enclosure 12, out of the housing body 34. Further, a pair of lock receiving portions 34*p*, to which the pair of locking pieces 63 are retained and locked, are formed. The pair of locking pieces 63 and the fixing guide piece 64 are pushed toward the guide receiving recess 34*g* and the pair of lock receiving portions 34*p* along the extension direction of the board-side connecting portions 44, 54. Then, the fixing guide piece 64 is fit into the guide receiving recess 34*g* and the pair of locking pieces 64 retain and lock the pair of lock receiving portions 34*p*, whereby the auxiliary member 60 is fixed to the housing 32.

The structure for fixing the auxiliary member to the housing is not limited to that of the above example. The auxiliary member may be fixed to the housing by fitting parts of the protection plates into recesses of the housing. The auxiliary member may be fixed to the housing by screwing, welding or bonding.

Further, the auxiliary member 60 includes an alignment plate 80 for holding the board-side connecting portions 44, 54 passed therethrough.

The alignment plate 80 is arranged between the pair of protection plates 70.

More specifically, the alignment plate 80 is in the form of a plate expanding between the tip edges of the rectangular extending parts on the other sides of the pair of protection plates 70. The alignment plate 80 is connected to the fixing intermediate piece 62 via a step.

The alignment plate 80 is formed with a plurality of through holes 81, 83, through which the board-side connecting portions 44, 54 of the plurality of respective terminals 40, 50 are passed.

In the alignment plate 80, the elongated through holes 81 are formed at positions corresponding to the board-side connecting portions 44 and the round through holes 83 are formed at positions corresponding to the board-side connecting portions 54. Here, the alignment plate 80 is in the form of a rectangular plate and three through holes 81 are formed side by side in a row on each of both left and right sides. Further, two through holes 83 are formed side by side in a row in a widthwise center of the alignment plate 80.

More specifically, six through holes 81 are located side by side in both outer columns of 3×3 grid points, and the two through holes 83 are located at the positions of two grid points near the housing body 34 in a center column of the 3×3 grid points.

The plurality of board-side connecting portions 44 are respectively passed through and arranged in the through holes 81, and the plurality of board-side connecting portions 54 are respectively passed through and arranged in the through holes 83. In this way, the plurality of board-side connecting portions 44 and the plurality of board-side connecting portions 54 are easily kept in a predetermined array state, and easily collectively inserted into the through holes 16*h* formed in the board 16.

Note that the through holes 81, 83 may be so dimensioned that the board-side connecting portions 44, 54 are press-fit thereinto. The through holes 81, 83 may be so dimensioned that the board-side connecting portions 44, 54 are loosely inserted thereinto to such an extent that the board-side connecting portions 44, 54 can be held without hindering the insertion of the board-side connecting portions 44, 54 into the through holes 16*h*.

As described above, the board-side connecting portions 44, 54 are inserted through the through holes 81, 83. To more improve insulation property between the terminals 40, 50, it is requested to increase creepage distances between the board-side connecting portions 44, 54 in the alignment plate 80.

Figure 7:
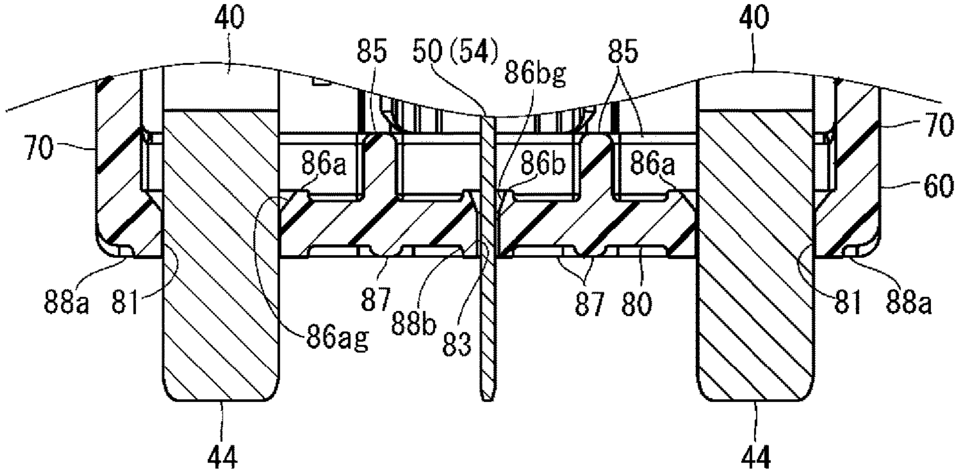
FIG. 7 is a section along VII-VII of FIG. 6.
Figure 8:
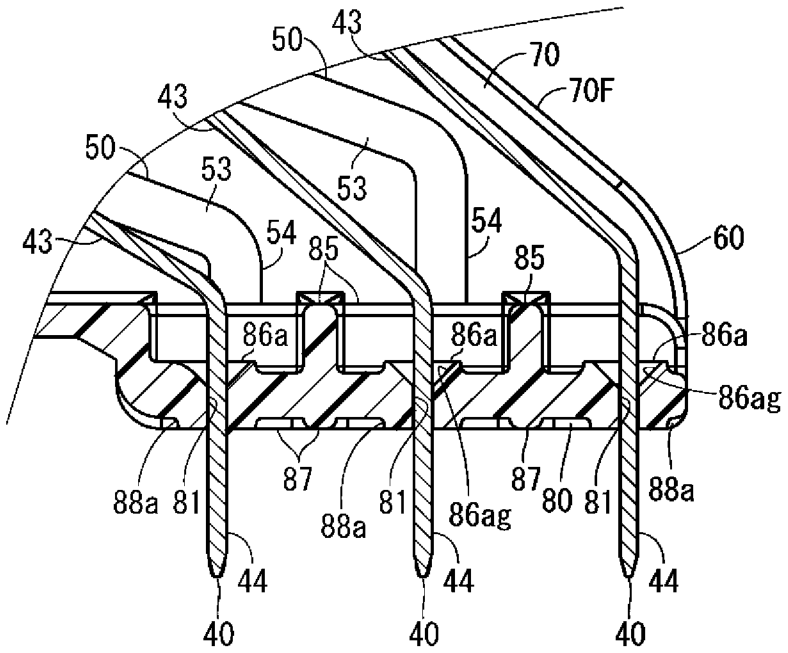
FIG. 8 is a section along VIII-VIII of FIG. 6.

FIG. 7 is a section along VII-VII of FIG. 6, and FIG. 8 is a section along VIII-VIII of FIG. 6. As shown in FIGS. 3 to 8, the alignment plate 80 is configured as follows to increase the creepage distances.

That is, the alignment plate 80 is formed with protrusions 85, 86*a*, 86*b*, 87, 88*a* and 88*b* located between the plurality of through holes 81, 83 for increasing the creepage distances between the board-side connecting portions 44, 54 respectively passed through the plurality of through holes 81, 83.

The protrusions 85, 86*a*, 86*b*, 87, 88*a* and 88*b* are parts projecting from either one of principal surfaces of the alignment plate 80. Since the protrusions 85, 86*a*, 86*b*, 87, 88*a* and 88*b* project from the alignment plate 80, the creepage distances between the board-side connecting portions 44, 54 are increased as compared to the case where the protrusions 85, 86*a*, 86*b*, 87, 88*a* and 88*b* are absent.

The protrusions 86*a*, 88*a* are opening peripheral edge protrusions formed along the edges of the through holes 81. The through holes 81 are through holes having an elongated rectangular shape, and the protrusions 86*a*, 88*a* are formed into a convex elongated rectangular parallelepiped shape. The protrusions 86*a* are formed on an inner surface, which is one principal surface of the alignment plate 80. The protrusions 88*a* are formed on an outer surface, which is the other principal surface of the alignment plate 80. Thus, the protrusions 86*a*, 88*a* are formed on the both surfaces of the alignment plate 80.

The protrusion 86*a* has a guiding surface 86*ag* for guiding the board-side connecting portion 44 into the through hole 81. The guiding surface 86*ag* is shaped to be gradually narrower from outside toward inside, here formed into a shape obtained by cutting off top parts of outer side surfaces of a four-sided pyramid. The board-side connecting portion 44 is guided toward a center of the through hole 81 by this guiding surface 86*ag*, and smoothly inserted into the through hole 81.

The protrusion 88*a* includes a hole continuous from the through hole 81 while having the same size. It can be grasped that the through hole 81 is made longer also by a projection dimension of the protrusion 88*a*. Thus, the board-side connecting portion 44 is also passed through and held by the protrusion 88*a*, and more firmly held.

The protrusions 86*b*, 88*b* are opening peripheral edge protrusions formed along the edges of the through holes 83. The through holes 83 are round through holes, and the protrusions 86*b*, 88*b* are formed into a convex short cylindrical shape. The protrusions 86*b* are formed on the inner surface, which is the one principal surface of the alignment plate 80. The protrusions 88*b* are formed on the outer surface, which is the other principal surface of the alignment plate 80. Thus, the protrusions 86*b*, 88*b* are formed on the both surfaces of the alignment plate 80.

The protrusion 86*b* has a guiding surface 86*bg* for guiding the board-side connecting portion 54 into the through hole 83. The guiding surface 86*bg* is shaped to be gradually narrower from outside toward inside, here formed into a tapered shape. The board-side connecting portion 54 is guided toward a center of the through hole 83 by this guiding surface 86*bg*, and smoothly inserted into the through hole 83.

The protrusion 88*b* includes a hole continuous from the through hole 83 while having the same size. It can be grasped that the through hole 83 is made longer also by a projection dimension of the protrusion 88*b*. Thus, the board-side connecting portion 54 is also passed through and held by the protrusion 88*b*, and more firmly held.

The protrusions 85, 87 are intermediate protrusions separated from the plurality of through holes 81, 83 and located between the plurality of through holes 81, 83. The protrusion 85 is formed on the inner surface, which is the one principal surface of the alignment plate 80. The protrusion 87 is formed on the outer surface, which is the other principal surface of the alignment plate 80. Thus, the protrusions 85, 87 are formed on the both surfaces of the alignment plate 80.

The protrusion 85 is a lattice-shaped protrusion partitioning the plurality of through holes 81, 83 on the inner surface of the alignment plate 80. More specifically, two vertical ridges and two horizontal ridges are formed to orthogonally intersect each other, whereby the protrusion 85 is formed. The protrusion 85 passes between the through holes 81, 83, preferably passes through centers between the through holes 81, 83.

Partitions are formed by the vertically and horizontally extending protrusion 85, and the through hole 81 or 83 is located in a center of each partition. Although the protrusion 85 projects more than the protrusions 86*a*, 86*b*, it is not essential.

The protrusion 87 is a lattice-shaped protrusion partitioning the plurality of through holes 81, 83 on the outer surface of the alignment plate 80. More specifically, two vertical ridges and two horizontal ridges are formed to orthogonally intersect each other, whereby the protrusion 87 is formed. The protrusion 87 passes between the through holes 81, 83, preferably passes through centers between the through holes 81, 83. Partitions are formed by the vertically and horizontally extending protrusion 87, and the through hole 81 or 83 is located in a center of each partition. Although the protrusion 87 has the same projection length as the protrusions 88*a*, 88*b*, it is not essential. If the alignment plate 80 is seen through, the protrusion 85 and the protrusion 87 are formed at the same position, but this is not essential.

Tip parts of the board-side connecting portions 44 and the board-side connecting portions 54 project from the alignment plate 80 and are located outside the pair of protection plates 70. Thus, in inserting the board connector 30 into the opening 14, the tip parts of the board-side connecting portions 44 and the board-side connecting portions 54 are desirably prevented from contacting the opening 14.

The above guide edges 70F function to guide the board connector 30 such that parts projecting from the alignment plate 80, out of the board-side connecting portions 44, 54, do not contact the opening 14.

A work example of inserting the board connector 30 into the opening 14 is described.

Figure 9:
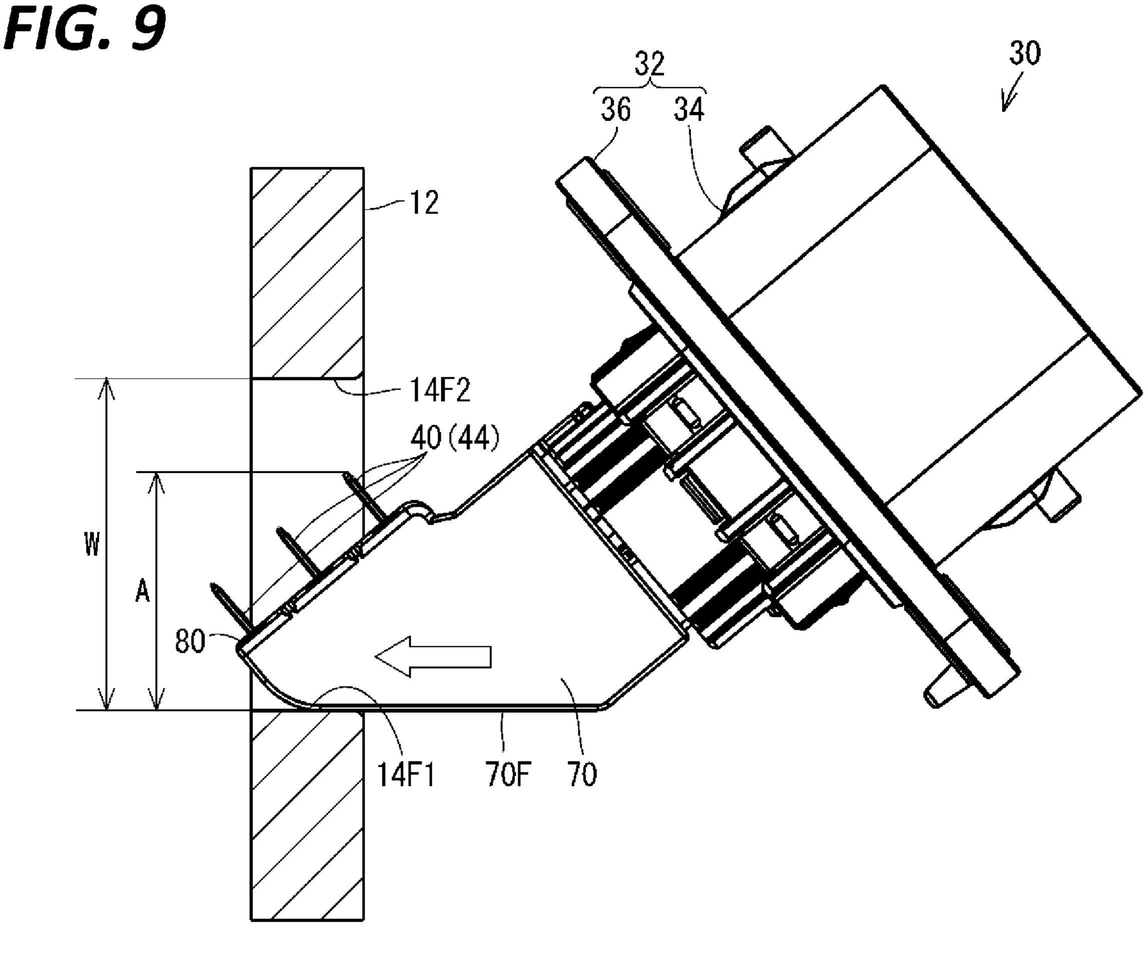
FIG. 9 is a diagram showing a work example of mounting the board connector on an enclosure.

It is assumed that the opening 14 has a first inner surface part 14F1 and a second inner surface part 14F2 facing the first inner surface part 14F1 across a gap as shown in FIG. 9. An interval enabling the arrangement of the housing body 34 is provided between the first and second inner surface parts 14F1, 14F2. It is assumed that the first and second inner surface parts 14F1, 14F2 have a flat surface part.

Figure 10:
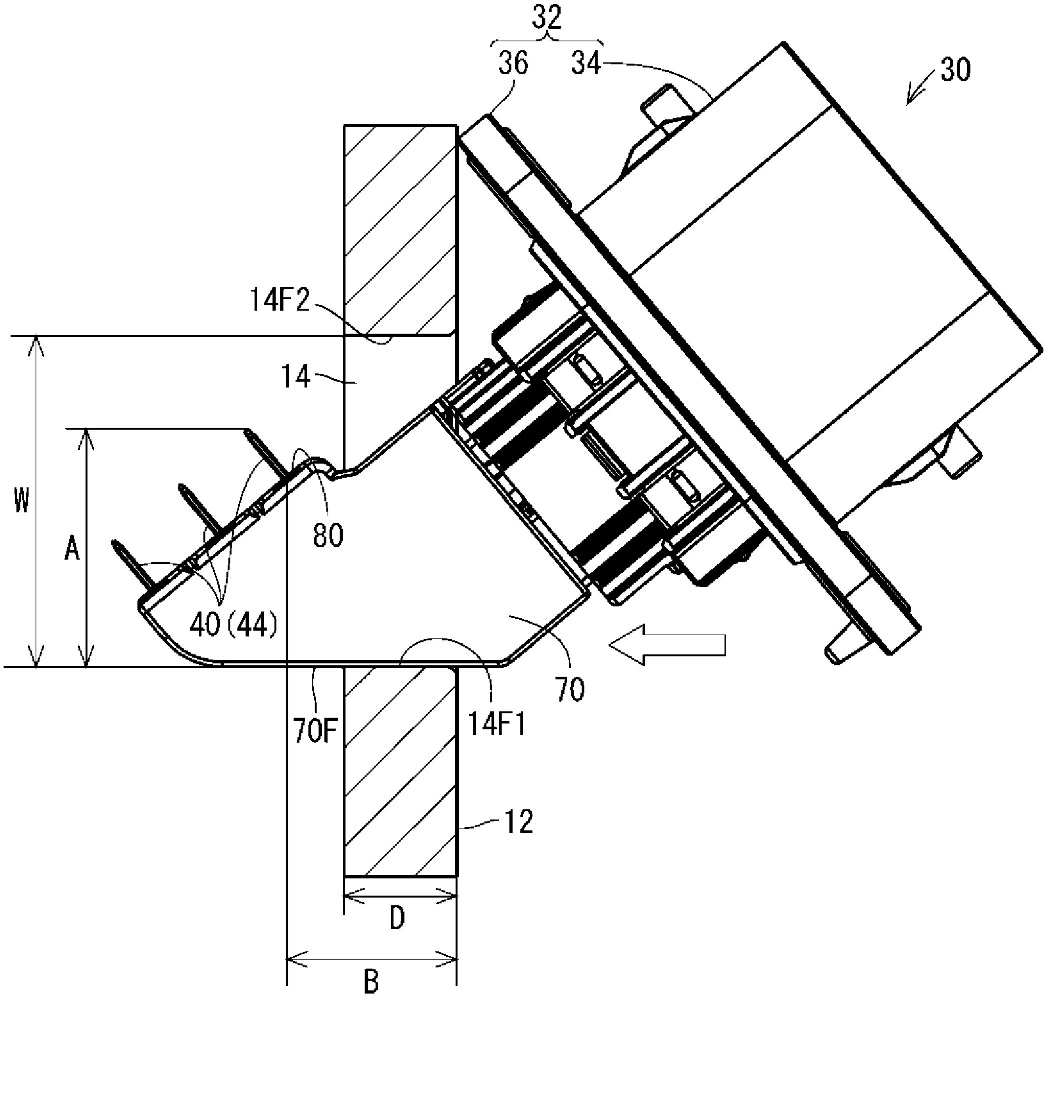
FIG. 10 is a diagram showing the work example of mounting the board connector on the enclosure.

In fixing the board connector 30 to the enclosure 12, the board-side connecting portions 44, 54, the coupling portions 43, 53 and the auxiliary member 60 are first inserted into the opening 14 as shown in FIG. 9. At this time, the respective guide edges 70F of the pair of protection plates 70 are pressed against the first inner surface part 14F1. At this time, the guide edges 70F are so pressed against the first inner surface part 14F1 that an extension direction of the guide edges 70F is along the first inner surface part 14F1. As shown in FIG. 10, the board connector 30 continues to be pushed toward the enclosure 12.

By pressing the guide edges 70F against the first inner surface part 14F1, the board connector 30 is inserted into the opening 14 with the guide edges 70F and the first inner surface part 14F1 kept in parallel. Thus, parts of the board-side connecting portions 44, 54 projecting from the alignment plate 80 can pass through the opening 14 at stable positions. Thus, it is difficult for the board-side connecting portions 44, 54 to contact the opening 14.

Here, it is assumed that W denotes a distance between the first and second inner surface parts 14F1, 14F2. A maximum projection length A of the board-side connecting portions 44, 54 with respect to the guide edges 70F is preferably smaller than the distance W. The maximum projection length A of the board-side connecting portions 44 with respect to the guide edges 70F is the maximum projection length of the board-side connecting portions 44, 54 with respect to a virtual plane, along which the two guide edges 70F passes, in a direction orthogonal to the virtual plane. If one board-side connecting portion 44, 54 is focused, the tip part of the board-side connecting portion 44, 54 is a most projecting part. In the relationship of the plurality of board-side connecting portions 44, 54, if the projection lengths of the board-side connecting portions 44, 54 from the alignment plate 80 are assumed to be equal, the projection length of the board-side connecting portion 44, 54 closest to the housing body 34, out of the plurality of board-side connecting portions 44, 54, is the maximum projection length.

By setting the maximum projection length A smaller than the distance W, the contact of the board-side connecting portions 44, 54 with the second inner surface part 14F2 is more reliably suppressed.

Figure 11:
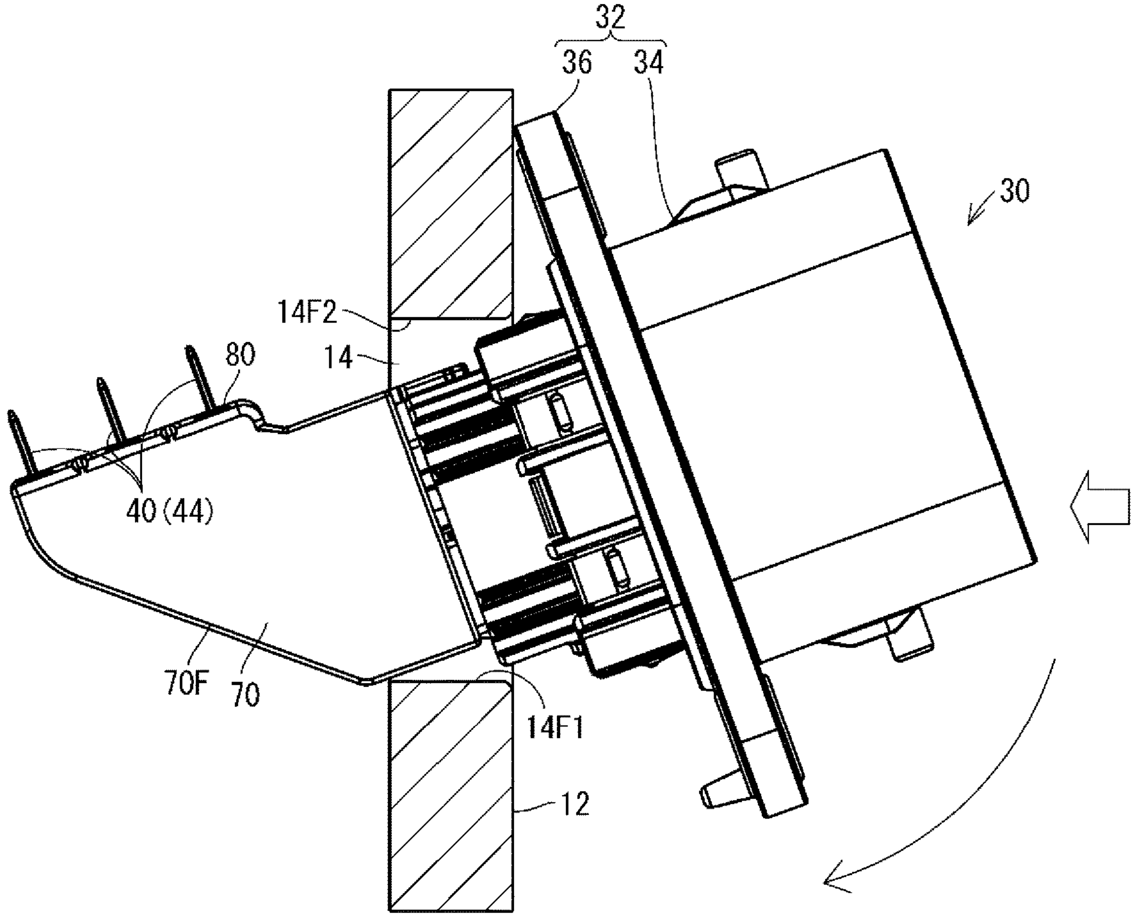
FIG. 11 is a diagram showing the work example of mounting the board connector on the enclosure.

If the board-side connecting portions 44, 54, the coupling portions 43, 53 and the auxiliary member 60 are inserted into the opening 14, the mounting piece 36 eventually contacts the outer surface of the enclosure 12 as shown in FIG. 10. If the board connector 30 continues to be pushed into the enclosure 12, the board connector 30 rotates about a contact position of the mounting piece 36 and the enclosure 12 as shown in FIG. 11.

At this time, to make it difficult for the board-side connecting portions 44, 54 to contact the opening 14, parts extending from the auxiliary member 60, out of the board-side connecting portions 44, 54, preferably enter the enclosure 12 through the opening 14.

To that end, a minimum interval B between the parts extending from the auxiliary member 60 (here, alignment plate 80), out of the board-side connecting portions 44, 54, and the mounting piece 36 may exceed a thickness D of the inner peripheral surface of the opening 14. Note that, if one board-side connecting portion 44, 54 is focused, the minimum interval B is an interval between the base end of the part projecting from the alignment plate 80, out of the board-side connecting portion 44, 54, and a surface of the mounting piece 36 on the side of the enclosure 12. Further, in the relationship of the plurality of board-side connecting portions 44, 54, the minimum interval B is an interval between the board-side connecting portion closest to the housing body 34, out of the plurality of board-side connecting portions 44, 45, and the surface of the mounting piece 36 on the side of the enclosure 12.

If the board connector 30 rotates about the contact position of the mounting piece 36 and the enclosure 12, the mounting piece 36 comes into contact with the outer surface of the enclosure 12 around the opening 14. In this state, the mounting piece 36 is fixed to the enclosure 12 using the screws S, whereby the board connector 30 is fixed to the enclosure 12.

The board-side connecting portions 44, 54 may be fixed to the board 16 before or after the board connector 30 is fixed to the enclosure 12.

Note that it is not essential to form the guide edges 70F. Further, it is also not essential to provide the board connector 30 with the pair of protection plates 70.

According to the board connector 30 and the electrical device 10 configured as just described, the alignment plate 80 includes the protrusions 85, 86*a*, 86*b*, 87, 88*a* and 88*b* located between the plurality of through holes 81, 83 for increasing the creepage distances between the board-side connecting portions 44, 54. Thus, the creepage distances between the board-side connecting portions 44, 54 respectively passed through the plurality of through holes 81, 83 are increased. In this way, insulation property between the terminals 40, 50 is more improved.

Further, the protrusions 86*a*, 86*b*, 88*a* and 88*b* are opening peripheral edge protrusions formed along the edges of the through holes 81, 83, and the creepage distances can be increased by these protrusions 86*a*, 86*b*, 88*a* and 88*b*.

The protrusions 86*a*, 86*b*, which are examples of the opening peripheral edge protrusions, have the guiding surfaces 86*ag*, 86*bg* for guiding the board-side connecting portions 44, 54 toward the through holes 81, 83. These guiding surfaces 86*ag*, 86*bg* facilitate the insertion of the board-side connecting portions 44, 54 into the through holes 81, 83.

Further, the protrusions 85, 87 are intermediate protrusions separated from the plurality of through holes 81, 83 and located between the plurality of through holes 81, 83, and the creepage distances can be increased by these protrusions 85, 87.

The creepage distances are more increased by using both the opening peripheral edge protrusions and the intermediate protrusions.

Further, the protrusions 85, 86*a* and 86*b* are formed on the inner surface of the alignment plate 80, and the protrusions 87, 88*a* and 88*b* are formed on the outer surface. Thus, the creepage distances can be increased on the both surfaces of the alignment plate 80.

The board-side connecting portions 44, 54 of the plurality of respective terminals 40, 50 extend in the direction intersecting the outer connecting portions 42, 52. In this way, the board-side connecting portions 44, 54 are easily inserted and connected to the through holes 16*h* of the board 16 intersecting with respect to the outer connecting portions 42, 52. If the board-side connecting portions 44, 54 extend in the direction intersecting the outer connecting portions 42, 52, the positions of the board-side connecting portions 44, 54 are easily disordered. In such a case, the plurality of board-side connecting portions 44, 54 are easily held at fixed positions by the alignment plate 80.

Further, since the auxiliary member 60 includes the pair of protection plates 70, the terminals 40, 50 can be protected by the pair of protection plates 70.

Further, according to this electrical device 10, the creepage distances of the terminals 40, 50 are large and insulation property between the terminals 40, 50 is improved.

Note that the positions and shapes of the protrusions 85, 86*a*, 86*b*, 87, 88*a* and 88*b* are not limited to those of the above example.

The board connector 30 needs not be provided with all of the protrusions 85, 86*a*, 86*b*, 87, 88*a* and 88*b*. Protrusions may be formed only on one surface side of an alignment plate. Further, protrusions may be formed only around through holes or only between a plurality of through holes.

It is not essential that the board connector 30 is provided with both of the terminals 40, 50. A board connector may include a plurality of terminals and at least one of the plurality of terminals may be a power terminal. For example, the terminals 50 may be omitted in the board connector 30.

Note that the respective configurations described in the above embodiment and modifications can be combined as appropriate as long as these do not contradict each other.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A board connector to be mounted on a board, comprising:

a plurality of terminals each including an outer connecting portion, a board-side connecting portion and a coupling portion located between the outer connecting portion and the board-side connecting portion;

a housing for holding the outer connecting portions of the plurality of respective terminals with the coupling portions and the board-side connecting portions of the plurality of respective terminals caused to extend away from the housing; and an auxiliary member supported by the housing on a side of the housing from which the coupling portions and the board-side connecting portions extend away, at least one of the plurality of terminals being a power terminal, the auxiliary member including an alignment plate having a plurality of through holes, the board-side connecting portions of the plurality of terminals being respectively passed through the through holes, and the alignment plate including protrusions located between the plurality of through holes for increasing creepage distances between the board-side connecting portions respectively passed through the plurality of through holes, the alignment plate having an inner surface and an outer surface, the protrusions being formed on both the inner surface and the outer surface of the alignment plate, the inner surface and the outer surface being opposing surfaces of the alignment plate.

2. The board connector of claim 1, wherein the protrusions include opening peripheral edge protrusions formed along edges of the through holes.

3. The board connector of claim 2, wherein the opening peripheral edge protrusion has a guiding surface for guiding the board-side connecting portion into the through hole.

4. The board connector of claim 1, wherein the protrusions include an intermediate protrusion separated from the plurality of through holes and located between the plurality of through holes.

5. The board connector of claim 1, wherein the board-side connecting portions of the plurality of respective terminals extend in a direction intersecting the outer connecting portions.

6. The board connector of claim 1, wherein the auxiliary member includes a pair of protection plates for collectively covering the coupling portions of the plurality of terminals from both sides of the auxiliary member that extend parallel to a longitudinal axis of the housing.

7. An electrical device, comprising:

the board connector of claim 1;

an enclosure including an opening; and the board accommodated in the enclosure, the board connector being fixed to the enclosure while being passed through the opening, and the board-side connecting portions extending away from the housing being fixed to the board in the enclosure.

8. The board connector of claim 1, wherein some of the protrusions comprise a plurality of vertical ridges and a plurality of horizontal ridges orthogonally intersecting the vertical ridges.

* * * * *